United States Patent
Wang et al.

(10) Patent No.: US 8,558,605 B1
(45) Date of Patent: Oct. 15, 2013

(54) FREQUENCY MIXER TOPOLOGY PROVIDING HIGH LINEARITY, LOW NOISE AND HIGH GAIN

(75) Inventors: Xudong Wang, Colorado Springs, CO (US); Thomas E. Schiltz, Colorado Springs, CO (US); William B. Beckwith, Monument, CO (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 13/595,600

(22) Filed: Aug. 27, 2012

(51) Int. Cl.
*G06F 7/44* (2006.01)

(52) U.S. Cl.
USPC ............ 327/359; 455/323; 455/326; 327/355

(58) Field of Classification Search
USPC ............................ 327/355–361; 455/323, 326
See application file for complete search history.

(56) References Cited

U.S. PATENT DOCUMENTS

| | | | | |
|---|---|---|---|---|
| 3,078,420 | A * | 2/1963 | Bussard | 330/285 |
| 7,509,222 | B2 * | 3/2009 | Edge | 702/107 |
| 7,599,675 | B2 * | 10/2009 | Mu et al. | 455/240.1 |
| 2002/0163375 | A1 * | 11/2002 | Wu et al. | 327/356 |
| 2010/0081408 | A1 * | 4/2010 | Mu et al. | 455/326 |

* cited by examiner

*Primary Examiner* — Dinh T. Le
(74) *Attorney, Agent, or Firm* — McDermott Will & Emery LLP

(57) ABSTRACT

Frequency conversion circuitry has an input node for receiving an input signal at a first frequency and an output node for producing an output signal at a second frequency different from the first frequency. A mixer circuit is responsive to the input signal for producing a signal at the second frequency. A step down impedance transformation circuit is coupled between the input node and an input of the mixer circuit for providing input impedance of the mixer circuit lower than impedance at the input node. An amplifier circuit is coupled between an output of the mixer circuit and the output node for amplifying the signal at the second frequency produced at the output of the mixer circuit. The mixer circuit is configured for providing input impedance of the output amplifier lower than the impedance at the input node.

19 Claims, 9 Drawing Sheets

BACKGROUND

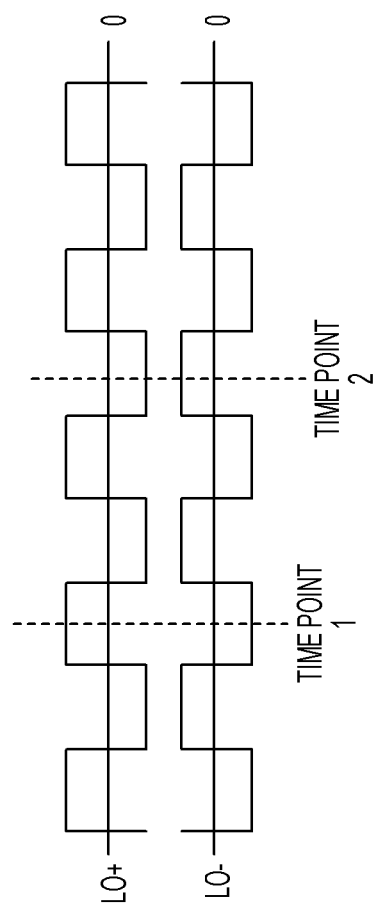

FREQUENCY MIXER TOPOLOGY PROVIDING HIGH LINEARITY, LOW NOISE AND HIGH GAIN

TECHNICAL FIELD

This disclosure relates to radio frequency (RF) and microwave systems, and more particularly, to a new topology for frequency mixers.

BACKGROUND ART

Frequency mixers are critical components in RF and microwave systems that convert a signal from one frequency to another. FIG. 1 shows a conventional switching/commutating mixer 10 also known as a double balanced mixer. It is also called a passive mixer because there is no DC current flowing through FET devices in the mixer.

The mixer 10 provides frequency up-conversion and down-conversion by converting the frequency of a signal applied at its differential input nodes input+ and input− into the frequency of a signal produced at its differential output nodes output+ and output−. Local oscillator (LO) nodes LO+ and LO− are supplied with signals LO+ and LO− at the LO frequency to control up-conversion or down-conversion of the input frequency. For up-conversion application, frequency components of the signal at the output nodes include the desired frequency of the input signal plus the LO frequency. For down-conversion application, frequency components of the output signal include the desired frequency of the input signal minus the LO frequency or the LO frequency minus the input frequency.

The switching/commutating mixer 10 includes MOSFETs M1, M2, M3 and M4 controlled by LO signals at the nodes LO+ and LO−. The LO signals controls the MOSFETs M1 to M4 to switch or commutate the input signals at the LO rate so as to produce the output signal at a frequency which is the difference or sum of the mixer's input frequency and the LO frequency.

The most important parameters defining a mixer's performance are conversion gain (Gc), input third order intercept point (IIP3) and noise figure (NF). The conversion gain is a ratio of an output power of the mixer to an input power of the mixer. The third order intercept point is a point at which the power in the third-order product and the fundamental tone intersect, when the mixer performance is assumed to be linear with respect to power input. Hence, the third order intercept point quantifies the non-linearity of the mixer. The noise figure is a measure of degradation of the signal-to-noise ratio (SNR), caused by components in a radio frequency (RF) signal chain.

Generally, the mixer 10 may have conversion loss of about 6 dB or more. To add gain, a mixer system needs an amplifier stage that can be coupled after the mixer 10. The amplifier and the mixer can be arranged as two separate chips or the amplifier can be integrated onto the chip of the mixer. In case of two chips, both chips are usually designed to be 50 ohm single ended at their input and output ports. In the integrated solution, a common emitter amplifier can be used, and the input impedance of the amplifier should be made about 50 ohm so that the input impedance of the mixer can be easily converted to 50 ohm single-ended impedance. In both cases, the IIP3 of the mixer system will be limited because the impedance between the output of the mixer 10 and the amplifier input is about 50 ohm. Also the amplifier stage will cause a pole which results in limited output bandwidth.

Therefore, there is a need for a new mixer topology that would improve linearity and conversion gain of a conventional mixer, while providing a low noise figure.

SUMMARY OF THE DISCLOSURE

In accordance with one aspect of the present disclosure, frequency conversion circuitry has an input node for receiving an input signal at a first frequency and an output node for producing an output signal at a second frequency different from the first frequency.

A mixer circuit is responsive to the input signal for producing a signal at the second frequency. A step down impedance transformation circuit is coupled between the input node and an input of the mixer circuit for providing input impedance of the mixer circuit lower than impedance at the input node. An amplifier circuit is coupled between an output of the mixer circuit and the output node for amplifying the signal at the second frequency produced at the output of the mixer circuit. The mixer circuit is configured for providing input impedance of the output amplifier lower than the impedance at the input node.

In accordance with one embodiment, the frequency conversion circuitry may include a DC blocking circuit coupled between the mixer circuit and the amplifier circuit for preventing a DC current from flowing from the amplifier circuit to the mixer circuit. A low pass filter circuit may be coupled to the amplifier circuit for providing a DC current path that allows the DC current to flow from the amplifier circuit to a ground terminal.

In accordance with another embodiment, the mixer circuit, the step down impedance transformation circuit and the amplifier circuits may be configured for providing a DC current path that allows a DC current to flow from the amplifier circuit via the mixer circuit to the step down impedance transformation circuit.

The mixer circuit may include a first switching circuit controlled by a first local oscillator signal and a second switching circuit controlled by a second switching oscillator signal.

A first DC current path may be created via the first switching circuit between the amplifier circuit and the step down impedance transformation circuit when the first switching circuit is on, and the second switching circuit is off.

A second DC current path may be created via the second switching circuit between the amplifier circuit and the step down impedance transformation circuit when the second switching circuit is on, and the first switching circuit is off.

The step down impedance transformation circuit may include a balun for converting an unbalanced signal at a single ended input of the frequency conversion circuitry into a balanced signal supplied to the mixer circuit.

Alternatively, the step down impedance transformation circuit may include a step down transformer for receiving differential input signals supplied to the frequency conversion circuitry to produce a balanced signal supplied to the mixer circuit.

In one example, the first switching circuit may include a first pair of transistors, and the second switching circuit may include a second pair of transistors. The amplifier circuit may include first and second transistor devices having a common control electrode supplied with bias voltage. The first DC current path may be provided via the first transistor device and the first pair of transistors, and the second DC current path may be provided via the second transistor device and the second pair of transistors.

In another example, the first switching circuit may be provided by a first transistor controlled by the first local oscillator signal, and the second switching circuit is provided by a second transistor controlled by the second oscillator signal. The amplifier circuit may include a single transistor device coupled to a common node between the first transistor and the second transistor and supplied with bias voltage.

In a further example, a frequency filter circuit may be coupled between the mixer circuit and the amplifier circuit.

In another example, each of the first and second switching circuits in the mixer circuit may include multiple field effect transistors (FETs), and the amplifier circuit may include multiple transistors. The mixer circuit and the amplifier circuit may be configured so as to utilize channel resistance of the FETs as ballasting resistors for the amplifier circuit.

In a further example, the frequency conversion circuitry may further include a local oscillator balun for converting an unbalanced signal at a single ended local oscillator input of the frequency conversion circuitry into a balanced signal supplied to the mixer circuit.

An output balun may be added for converting a balanced signal at the output of the amplifier circuit into an unbalanced signal supplied from an output of the frequency conversion circuitry.

A local oscillator buffer amplifier may be coupled between a local oscillator input of the frequency conversion circuitry and the mixer circuit.

In accordance with another aspect of the present disclosure, a method of converting an input signal at first frequency supplied to an input node of circuitry into an output signal at a second frequency, different from the first frequency, involves producing by a mixer circuit a signal at the second frequency in response to the input signal. By an impedance transformation circuit, input impedance of the mixer circuit is provided at a level lower than impedance at the input node. By an amplifier circuit, the signal at the second frequency produced by the mixer circuit is amplified.

A DC current pass may be provided from the amplifier circuit via the mixer circuit to the impedance transformation circuit.

Alternatively, a DC current may be prevented from flowing from the amplifier circuit to the mixer circuit, and a DC current pass may be provided for allowing the DC current to flow from the amplifier circuit to a ground terminal.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features. In the figures, like reference numerals refer to the same or similar elements.

FIGS. 6a and 6b illustrate local oscillator (LO) signals that control a mixer circuit.

DETAILED DISCLOSURE OF THE EMBODIMENTS

The present disclosure will be made using specific examples presented below. It will become apparent, however, that the concept of the disclosure is applicable to any frequency conversion circuitry.

Figure 2:
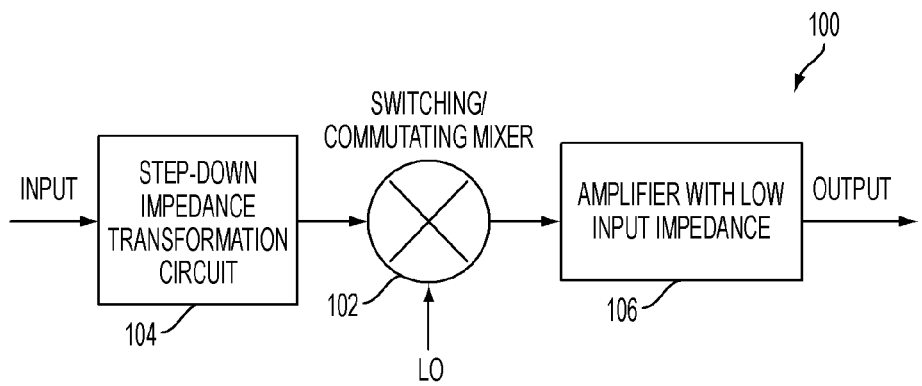
FIG. 2 illustrate frequency conversion circuitry of the present disclosure.

FIG. 2 illustrates an exemplary frequency conversion circuitry 100 of the present disclosure that converts the frequency of an input signal supplied at its input node into a frequency of an output signal produced at its output node. The frequency conversion circuitry 100 may perform frequency down-conversion to produce the output signal at a frequency lower than the frequency of the input signal. Alternatively, the frequency conversion circuitry 100 may perform frequency up-conversion to produce the output signal at a frequency higher than the frequency of the input signal.

Figure 1:
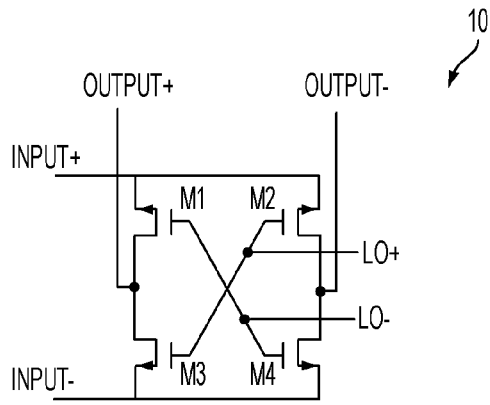
FIG. 1 shows a conventional switching/commutating mixer.

The frequency conversion circuitry 100 includes a switching/commutating mixer 102 which may be a frequency mixer that performs a switching operation to switch or commutate the input signal using a local oscillator (LO) signal to produce the output signal at a frequency equal to the difference or sum of the mixer's input frequency and LO frequency. In response to the input signal of the frequency conversion circuitry 100 applied at the input frequency, the mixer 102 produces an output signal at an output frequency corresponding to the frequency of the signal at the output node of the frequency conversion circuitry 100. The switching or commutating mixer 102 may be implemented using diode or FET topologies. An exemplary topology of the switching/commutating mixer is shown in FIG. 1.

Also, the frequency conversion circuitry 100 may include a step-down impedance transformation circuit 104 coupled between the input node of the frequency conversion circuitry 100 and the input of the mixer 102, and an amplifier 106 coupled between the output of the mixer 102 and the output node of the frequency conversion circuitry 100. The step-down impedance transformation circuit 104 is configured for providing the input impedance of the mixer 102 lower than the impedance at the input node of the frequency conversion circuitry 100. For example, the input impedance of the frequency conversion circuitry 100 may be equal to 50 ohm. The step-down impedance transformation circuit 104 may be configured to provide the input impedance of the mixer 102 at a 25 ohm level, or even as low as 1 ohm. As discussed below, the step-down impedance transformation circuit 104 can be implemented using a balun or transformer having the number of turns in the primary winding greater than the number of turns in the secondary winding. Alternatively, a lumped L-C circuit can be used.

The amplifier 106 may convert DC power to AC power so that to provide power amplification of the output signal produced by the switching/commutating mixer 102. The output signal of the amplifier 106 is produced at the output frequency of the frequency conversion circuitry 100 corresponding to the frequency of the output signal produced by the switching/commutating mixer 102.

The switching/commutating mixer 102 is configured to pass the low input impedance of the mixer 102 to its output. As a result, low impedance is produced at the input of the amplifier 106. To match the low output impedance of the switching/commutating mixer 102, the amplifier 106 may be configured to have a low input impedance, for example in the range from 1 to 25 ohms.

The low input impedance amplifier 106 may be implemented using a common-base (CB) or common-gate (CG) amplifier topology. A DC biasing current is supplied to the input of a CB or CG amplifier to support its operation. In order for the CB or CG amplifier to be connected to the switching/commutating mixer 102, the output signal from the mixer 102 needs to be transferred to the amplifier 106 with minimum loss because the loss reduces the conversion gain and increases the noise figure of the frequency conversion circuitry 100. Also, the DC biasing current at the input of the CB or CG amplifier needs to be terminated to ground.

Figure 3:
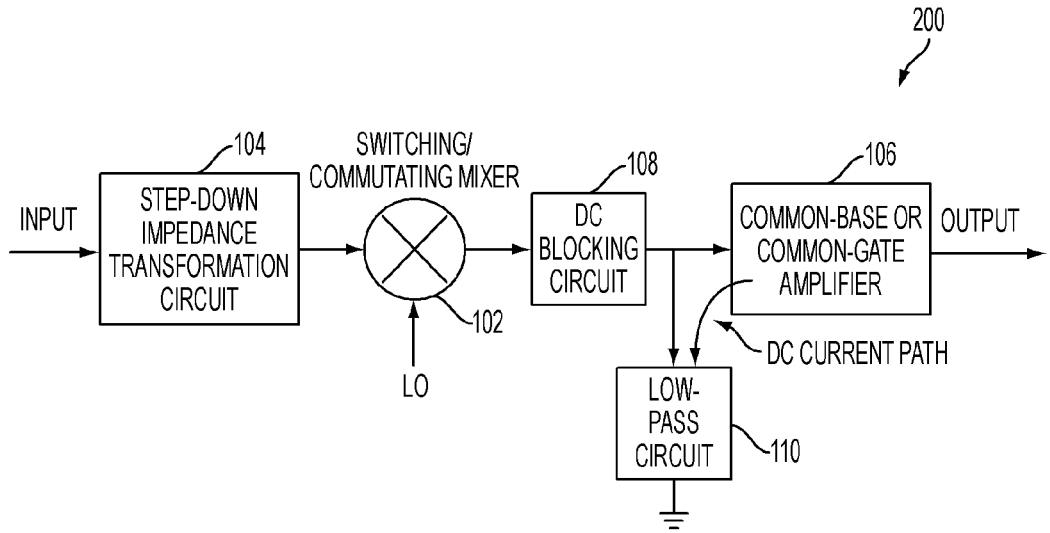
FIG. 3 shows an exemplary embodiment of the frequency conversion circuitry of the present disclosure.

FIG. 3 illustrates an exemplary frequency conversion circuitry 200 configured to support the CB or CG implementation of the output amplifier. In particular, in addition to the switching/commutating mixer 102, step-down transformation circuit 104 and the amplifier 106 implemented based on the CB or CG topology, the frequency conversion circuitry 200 includes a DC blocking circuit 108 and a low-pass filtering circuit 110. The DC blocking circuit 108 is coupled between the output of the mixer 102 and the input of the amplifier 106 so as to pass the output signal from the mixer 102 to the input of the amplifier 106 with minimum loss. At the same time, the DC blocking circuit 108 prevents the DC biasing current from flowing from the amplifier 106 to the mixer 102. The low-pass filtering circuit 110 is coupled between the amplifier 106 and the DC blocking circuit 108 to provide a DC current path that allows the DC bias current to flow from the amplifier 106 to a ground terminal. At the same time, the low-pass filtering circuit 110 prevents the output signal of the mixer 102 from being shorted to the ground terminal.

While the frequency conversion topology in FIG. 3 can provide high performance, the DC blocking circuit 108 and low-pass filtering circuit 110 can limit the output frequency range of the frequency conversion circuitry. Furthermore, due to their physical size, these elements are difficult to integrate on the same chip with other elements of the frequency conversion circuitry if the circuitry needs to operate at low output frequencies, for example, below 100 MHz.

Figure 4:
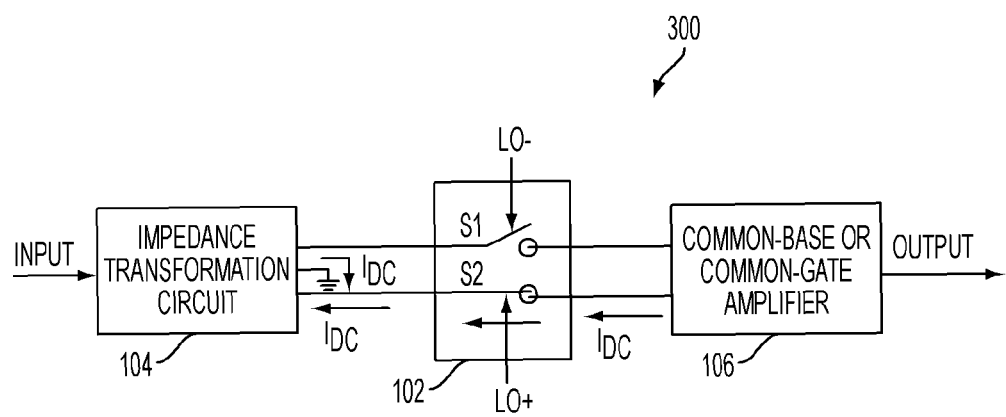
FIG. 4 shows another exemplary embodiment of the frequency conversion circuitry of the present disclosure.

FIG. 4 illustrates an exemplary frequency conversion circuitry 300 that provides very high linearity, low noise figure and high gain in a broad range of operating frequencies. In the circuitry 300, the switching/commutating mixer 102, the step down impedance transformation circuit 104 and the amplifier 106 are configured for providing a DC current path that allows a DC current to flow from the amplifier 106 via the mixer 102 to the step down impedance transformation circuit 104. As schematically illustrated in FIG. 4, the switching/commutating mixer 102 includes switching circuits S1 and S2 controlled by LO+ and LO− signals to provide commutation of signals from the inputs of the mixer 102 to its outputs. The amplifier 106 implemented based on CB or CG topology is connected directly to an output of the mixer 102 so as to provide a DC current pass from the amplifier 106 to the impedance transformation circuit 104 via the switch S1 or S2 of the mixer 102.

The DC current pass allows the DC biasing current $I_{DC}$ to flow from the amplifier 106 to the impedance transformation circuit 104 via the switch S1 when the switch S1 is on, and switch S2 is off. The DC biasing current $I_{DC}$ flows from the amplifier 106 to the impedance transformation circuit 104 via the switch S2 when the switch S2 is on, and switch S1 is off. The impedance transformation circuit 104 is configured to allow the DC biasing current $I_{DC}$ to flow to a ground terminal. The frequency conversion circuitry 300 may be configured for performing frequency down-conversion to produce the output signal at a frequency lower than the frequency of the input signal. Alternatively, the frequency conversion circuitry 300 may be configured for performing frequency up-conversion to produce the output signal at a frequency higher than the frequency of the input signal.

Figure 5A:
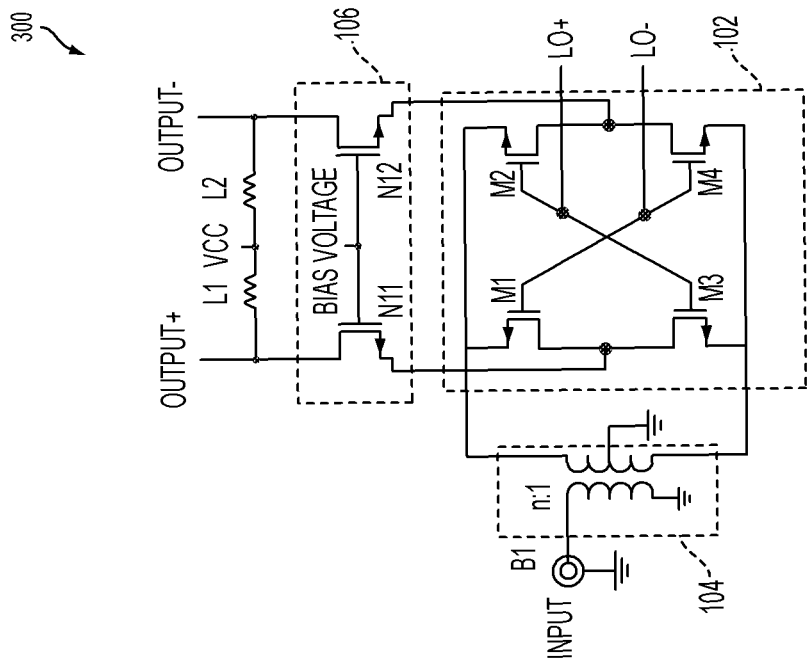
FIGS. 5a and 5b illustrate exemplary implementations of the frequency conversion circuitry of the present disclosure.
Figure 5B:
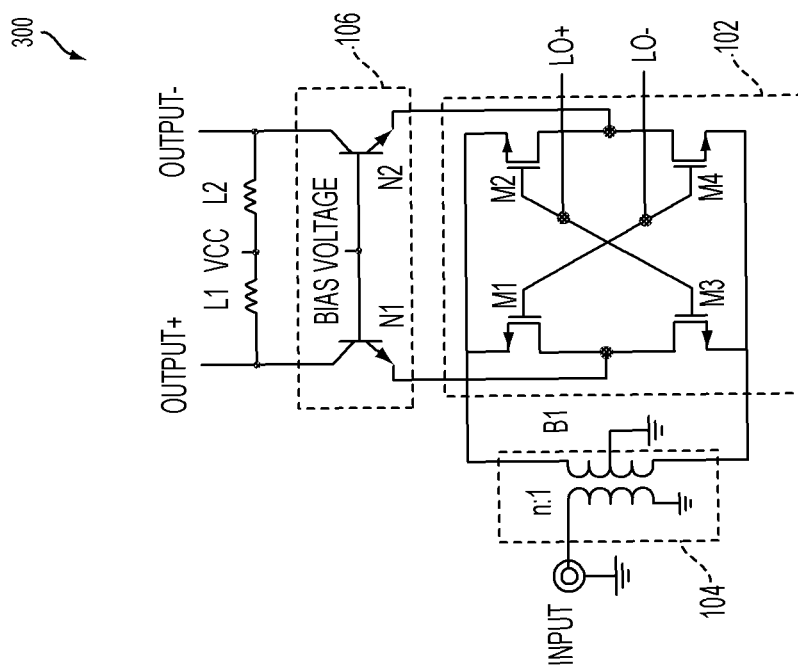

FIGS. 5a and 5b show exemplary implementations of the frequency conversion circuitry 300, in which the switching/commutating mixer 102 is implemented using a double balanced MOSFET mixer similar to the mixer shown in FIG. 1. FIG. 5a illustrates the frequency conversion circuitry 300, in which the amplifier 106 is implemented based on CB topology using bipolar NPN transistors N1 and N2 having their bases supplied with bias voltage. Emitters of the transistors N1 and N2 are respectively coupled to MOSFET pairs M1, M3 and M2, M4 of the mixer 102. Collectors of the transistors N1 and N2 are connected to outputs output+ and output− of the frequency conversion circuitry 300. Power supply voltage VCC is provided to the collectors of N1 and N2 via respective inductors L1 and L2.

The impedance transformation circuit 104 is implemented as a balun B1 having its primary winding coupled to a single ended radio frequency (RF) input of the frequency conversion circuitry 300. The balun B1 has a turns ratio n:1 between its primary and secondary inductance, where n is greater than 1, which may be selected based on design considerations. As one skilled in the art would realize, a balun is an electrical device that converts between a balanced signal (two signals working against each other where ground is irrelevant) and an unbalanced signal (a single signal working against ground or pseudo-ground). The balun B1 in FIGS. 5a and 5b may convert a single ended unbalanced input signal of the frequency conversion circuitry 300 into a balanced signal supplied to the double balanced mixer 102. Due to the n:1 turns ratio between its primary and secondary inductances, the balun B1 may transform the 50 ohm input impedance of the frequency conversion circuitry 300 to a low impedance, for example, in the range from 1 ohm to 25 ohms, so as to provide low impedance at the input of the mixer 102.

FIG. 5b illustrates the frequency conversion circuitry 300, in which the amplifier 106 is implemented based on CG topology using MOSFETs N11 and N12 having their gates supplied with bias voltage, sources coupled to the MOSFET pairs of the mixer 102, and drains coupled to the outputs output+ and output− of the frequency conversion circuitry 300 and supplied with power supply voltage VCC. The other elements in FIG. 5b are similar to the corresponding elements in FIG. 5a.

As one skilled in the art would realize, the circuit topology in FIGS. 5a and 5b is not just a simple combination of a passive mixer and an output amplifier, but innovative circuitry having unique features. In particular, in the frequency conversion circuitry in FIGS. 5a and 5b, DC current passes are provided to enable the DC current of the amplifier 106 to flow through the mixer 102. The FETs in the mixer 106 are operating at their linear region, but still function as switches controlled by LO signals. Because the FETs are operating in the linear region, the source node and drain node of these FETs are interchangeable. The DC currents from the emitters or sources of the CB or CG amplifier 106 flow through the MOSFETs M1-M4 in the mixer 102, and are controlled by the LO polarity.

Figure 7A:
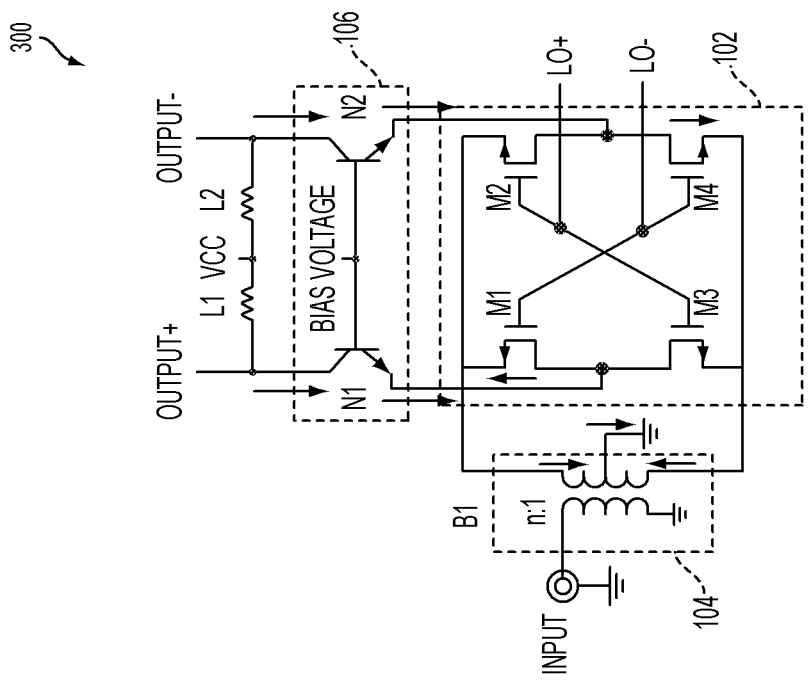
FIGS. 7a and 7b show DC current paths in the frequency conversion circuitry of the present disclosure.
Figure 7B:
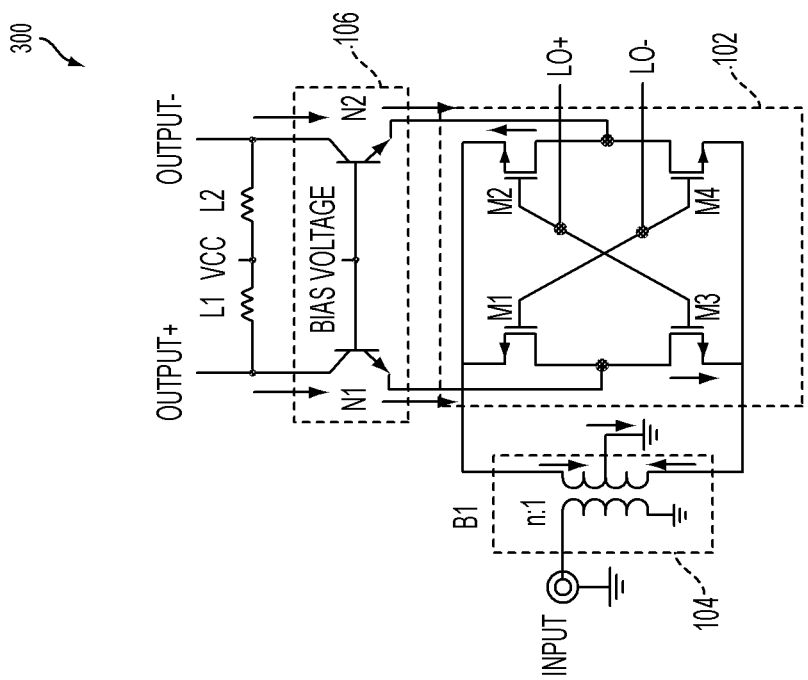

FIGS. 6a and 6b are timing diagrams illustrating signals LO+ and LO− that control the mixer 102. FIG. 7a illustrates a DC current path in the frequency conversion circuitry 300 in FIG. 5a when the signal LO+ has positive polarity and the signal LO− has negative polarity, as shown for example at time point 1 in FIGS. 6a and 6b. FIG. 7b illustrates a DC current path in the frequency conversion circuitry 300 in FIG. 5a when the signal LO+ has negative polarity and the signal LO− has positive polarity, as shown for example at time point 2 in FIGS. 6a and 6b.

The DC voltage for the MOSFETs M1-M4 is equal to the channel resistance of the MOSFETs multiplied by the value of the DC current flowing through the MOSFETs. At the time moment 1 indicated in FIGS. 6a and 6b, the signal LO+ is positive and the signal LO− is negative. MOSFETs M1 and M4 are turned off by the negative LO− signal, so that they are at high impedance condition. MOSFETs M2 and M3 are turned on by the positive LO+ signal. Therefore, they pass the input AC signal and the DC current from the amplifier 106 at the same time.

As illustrated in FIG. 7a, in a DC current path corresponding to the output+, the DC current flows from the collector of N1 to the emitter of N1, then via the on resistor in the channel of M3 to the lower part of the secondary inductance of the balun B1, and through the center tap of the secondary inductance of B1 to the ground. In a DC current path corresponding to the output−, the DC current flows from the collector of N2 to the emitter of N2, then via the on resistor in the channel of M2, to the upper part of the secondary inductance of balun B1, and through the center tap of the secondary inductance of B2 to the ground.

Similarly, at the time moment 2, the signal LO− is positive and the signal LO+ is negative. MOSFETs M2 and M3 are turned off by the negative LO+ signal, so that they are at high impedance condition. MOSFETs M1 and M4 are turned on by the positive LO− signal. Therefore, they pass the input AC signal and the DC current from the amplifier 106 at the same time.

As illustrated in FIG. 7b, in the DC current path corresponding to the output+, the DC current flows from the collector of N1 to the emitter of N1, then via the on resistor in the channel of M1 to the upper part of the secondary inductance of the balun B1, and through the center tap of the secondary inductance to the ground. In the DC current path corresponding to the output−, the DC current flows from the collector of N2 to the emitter of N2, and via the on resistor in the channel of M4 to the lower part of the secondary inductance of the balun B1, and through the center tap of the secondary inductance to the ground.

Further, the value of the total DC current of the frequency conversion circuitry 300 when the LO signal is applied differs from that value when the LO signal is not applied. The channel resistances of the MOSFETs M1-M4 are higher when the LO signal is not applied than when the LO signal is applied. The channel resistances of these MOSFETs act as degeneration resistors to active devices of the amplifier 106. As a result, when the LO signal is not applied, the DC current of the frequency conversion circuitry 300 is lower than when the LO signal is applied.

Also, the value of the DC current depends on the LO signal levels. A higher LO signal level results in lower average MOSFET channel resistances and causes higher DC current in the frequency conversion circuitry 300. As discussed below, an LO buffer amplifier with saturated gain may be used to supply the LO signal to the mixer 102 to keep the mixer performance consistent with different LO input signal levels.

Moreover, the circuit topology of the present disclosure provides a low input impedance of the amplifier 106. Similarly, the input impedance of the mixer 102 is also low. As a result, the frequency conversion circuitry 300 has high linearity.

Figure 8:
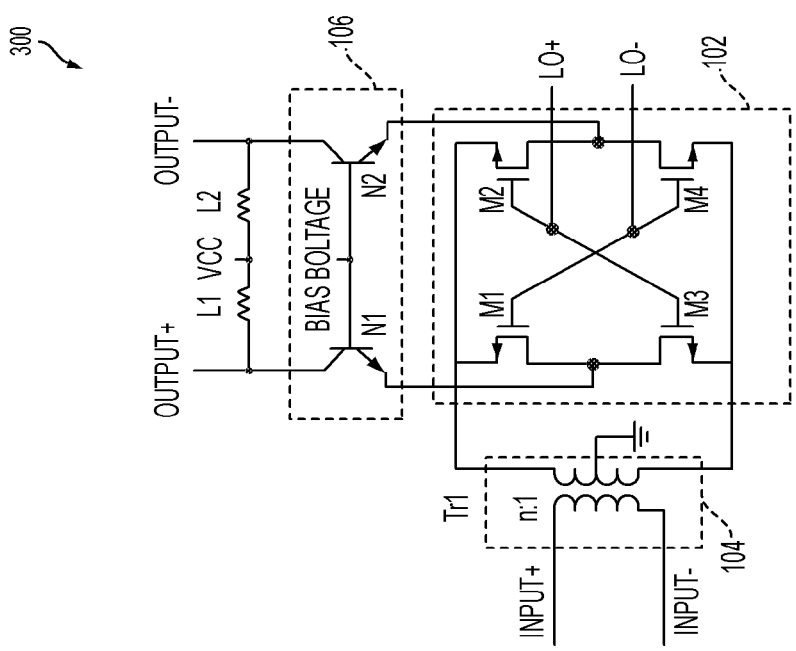
FIG. 8 show an alternative embodiment of the frequency conversion circuitry of the present disclosure.

FIG. 8 illustrates an alternative implementation of the frequency conversion circuitry 300. In the example in FIG. 8, the impedance transformation circuit 104 is implemented as an impedance step down transformer Tr1 instead of a balun B1 to enable the frequency conversion circuitry 300 to accept differential input signals. For example, the differential input signals may be supplied from a differential filter coupled to the input of the frequency conversion circuitry 300. The step down transformer Tr1 provides a differential RF input for the frequency conversion circuitry 300 and has primary and secondary turns with turns ratio n:1, where n is an integer greater than 1, which is selected based on design considerations. Both input and output of the impedance step down transformer Tr1 are balanced. The other elements of the circuitry in FIG. 8 are similar to elements in FIG. 5a.

Figure 9:
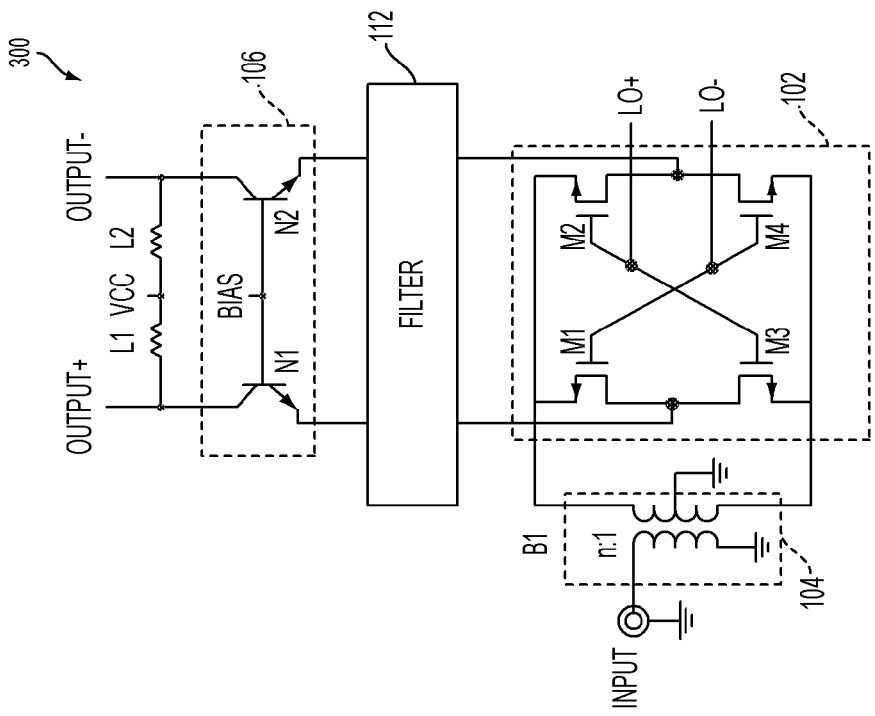
FIG. 9 illustrates another exemplary embodiment of the frequency conversion circuitry of the present disclosure.

FIG. 9 illustrates a further embodiment of the frequency conversion circuitry 300, in which a frequency filter 112 is coupled between the switching/commutating mixer 102 and the output amplifier 106 to eliminate unwanted harmonic and intermodulation frequency components to further improve the linearity of the frequency conversion circuitry 300. The filter 112 may be composed of passive LC components. The other elements of the circuit in FIG. 9 are similar to elements in FIG. 5a.

Figure 10:
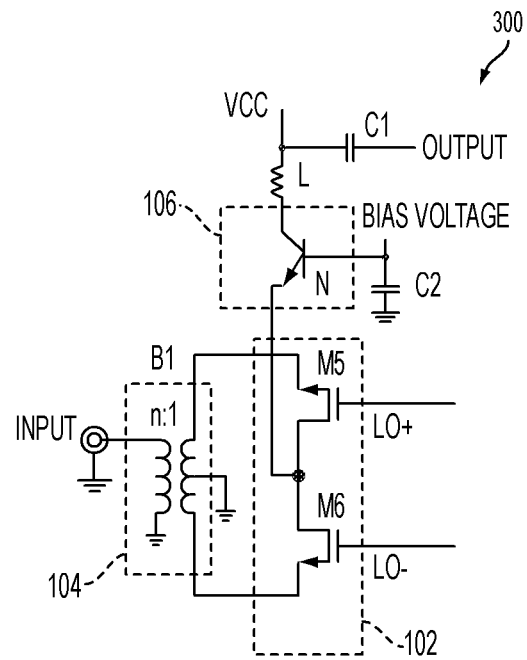
FIG. 10 illustrates a further exemplary embodiment of the frequency conversion circuitry of the present disclosure.

FIG. 10 illustrates another example of the frequency conversion circuitry 300, in which the mixer 102 is implemented using a single-balanced topology. In particular, the mixer 102 includes a single pair of MOSFETs M5 and M6 respectively controlled by the LO+ and LO− signals. The output amplifier 106 may include a bipolar NPN transistor N having the emitter coupled to a node between the MOSFETs M5 and M6. Via a capacitor C1 and resistor R, the collector of the transistor N is coupled to a single output of the frequency conversion circuitry 300. Bias voltage is supplied to the base of the transistor N. The capacitor C2 is coupled between a bias voltage terminal and a ground terminal. The balun B1 may be coupled to the sources of M5 and M6 to reduce the input impedance of the mixer 102 compared to the impedance at the input of the frequency conversion circuitry 300.

Since DC current flows through the MOSFETs M5 and M6 in the mixer 102, flicker noise at very low frequency range can be higher than when no DC current is present. However, the flicker noise is low because the MOSFETs are switched on and off between the saturation region and the accumulation region by the LO signal.

Figure 11:
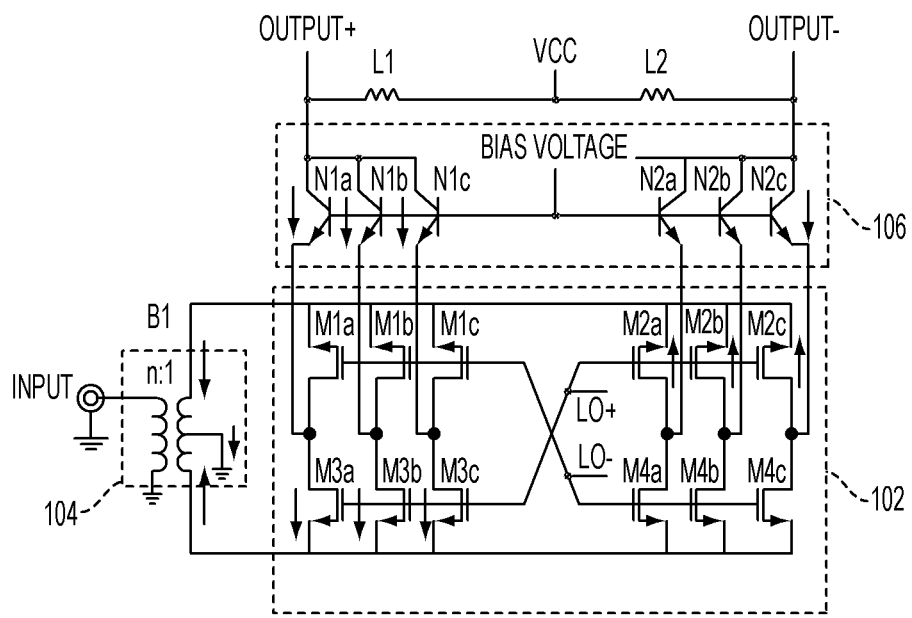
FIG. 11 illustrates another exemplary embodiment of the frequency conversion circuitry of the present disclosure.

FIG. 11 illustrates another example of the frequency conversion circuitry 300, in which the switching/commutating mixer 102 is implemented as a double balanced mixer with channel resistance of the MOSFETs used as balancing resistances for the output amplifier 106. The ballasting resistors are needed when high current is applied to the output amplifier 106 in order to limit the positive feedback between the current and junction temperature and keep the current among each individual active device balanced.

To support large current applications of the frequency conversion circuitry, the output amplifier 106 in FIG. 11 may include multiple bipolar NPN transistors N1a, N1b, N1c and N2a, N2b, N2c having their base nodes and collector nodes connected together. The mixer 102 may include multiple MOSFETs M1a, M1b, M1c, M2a, M2b, M2c, M3a, M3b, M3c and M4a, M4b, M4c having their gate nodes and source nodes connected together. The emitter of each NPN transistor in the output amplifier 106 may be connected to the drain nodes of MOSFETs in the mixer 102. In this arrangement, the channel resistance of the MOSFETs functions as the ballasting resistors for the output amplifier 106.

Arrows in FIG. 11 illustrate the DC current paths created when the LO+ signal is positive and when the LO− signal is negative. These current paths are similar to the current paths shown in FIGS. 7a and 7b, except that the DC current will go through each of the parallel active devices.

Figure 12:
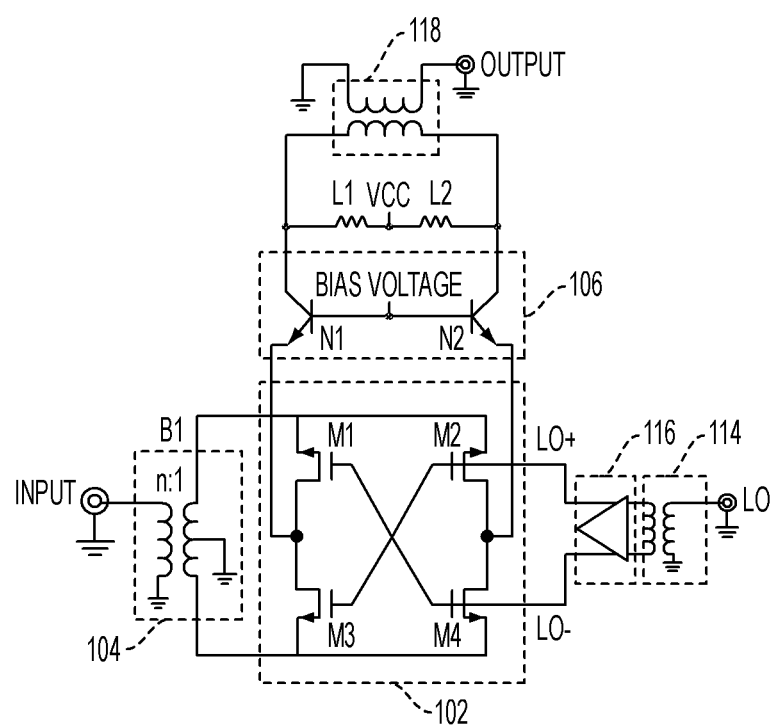
FIG. 12 shows a further embodiment of the frequency conversion circuitry of the present disclosure.
Figure 13:
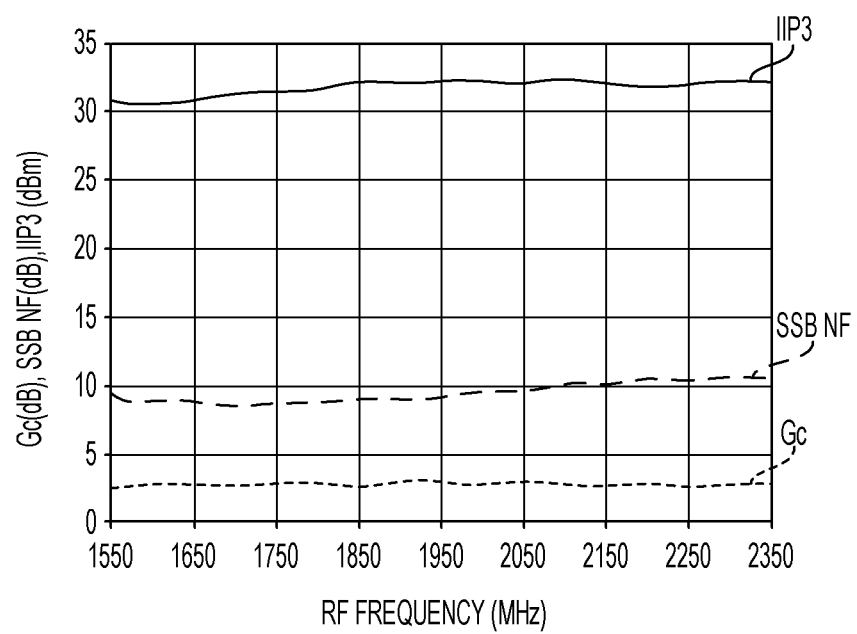
FIG. 13 illustrates performance characteristics of the frequency conversion circuitry of the present disclosure.

FIG. 12 illustrates an example of a frequency conversion circuitry that includes an LO balun 114, an LO buffer amplifier 116 and an output balun 118, in addition to the mixer 102, the impedance transformation circuit 104 and the output amplifier 106. The LO balun 114 may be provided at the LO control input of the frequency conversion circuitry. The output balun 118 may be provided at the output of the frequency conversion circuitry. They may be provided as external elements or integrated onto the chip of the frequency conversion circuitry.

The LO balun 114 may convert an unbalanced signal at a single ended local oscillator input LO of the frequency conversion circuitry into a balanced signal supplied to the mixer circuit. The output balun 118 may convert a balanced signal at the output of the amplifier circuit 106 into an unbalanced signal supplied from the output of the frequency conversion circuitry. Also, the baluns 114 and 118 may provide impedance transformation when the primary and secondary inductances of the baluns are different.

The LO buffer amplifier 116 can be a single stage amplifier or multistage amplifier provided between the LO input of the frequency conversion circuitry and the mixer circuit 102. The LO buffer amplifier 116 may be designed as a gain saturated amplifier so as to make the mixer performance less sensitive to the LO input power variation.

FIG. 12 illustrates the conversion gain (Cs), single-side band noise figure (SSB NF) and the input third order intercept point (IIP3) of a frequency conversion circuitry based a novel topology illustrated in FIG. 4. These characteristics where measured for the frequency conversion circuitry operating in the range between 1.55 GHz and 2.35 GHz. The measured characteristics show substantial improvement of the linearity, noise and gain parameters of the frequency conversion circuitry of the present disclosure compared to conventional frequency conversion circuits.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein.

What is claimed is:

1. Frequency conversion circuitry having an input node for receiving an input signal at a first frequency and an output node for producing an output signal at a second frequency different from the first frequency, the circuitry comprising:
    a switching/commutating mixer circuit responsive to the input signal for producing a signal at the second frequency,
    a step down impedance transformation circuit coupled between the input node and an input of the mixer circuit for providing input impedance of the mixer circuit lower than impedance at the input node, and
    a common-base or common-gate amplifier circuit having low input impedance coupled between an output of the mixer circuit and the output node for amplifying the signal at the second frequency produced at the output of the mixer circuit, the mixer circuit being configured for providing input impedance of the output amplifier lower than the impedance at the input node.

2. The circuitry of claim 1, further comprising:
    a DC blocking circuit coupled between the mixer circuit and the amplifier circuit for preventing a DC current from flowing from the amplifier circuit to the mixer circuit, and
    a low pass filter circuit coupled to the amplifier circuit for providing a DC current path that allows the DC current to flow from the amplifier circuit to a ground terminal.

3. The circuitry of claim 1, wherein the mixer circuit, the step down impedance transformation circuit and the amplifier circuits are configured for providing a DC current path that allows a DC current to flow from the amplifier circuit via the mixer circuit to the step down impedance transformation circuit.

4. The circuitry of claim 3, wherein the mixer circuit includes a first switching circuit controlled by a first local oscillator signal and a second switching circuit controlled by a second local oscillator signal.

5. The circuitry of claim 4, wherein a first DC current path is created via the first switching circuit between the amplifier circuit and the step down impedance transformation circuit when the first switching circuit is on, and the second switching circuit is off.

6. The circuitry of claim 5, wherein a second DC current path is created via the second switching circuit between the amplifier circuit and the step down impedance transformation circuit when the second switching circuit is on, and the first switching circuit is off.

7. The circuitry of claim 6, wherein the first switching circuit includes a first pair of transistors, and the second switching circuit includes a second pair of transistors.

8. The circuitry of claim 6, wherein the step down impedance transformation circuit includes a balun for converting an unbalanced signal at a single ended input of the frequency conversion circuitry into a balanced signal supplied to the mixer circuit.

9. The circuitry of claim 6, wherein the step down impedance transformation circuit includes a step down transformer for receiving differential input signals supplied to the frequency conversion circuitry to produce a balanced signal supplied to the mixer circuit.

10. The circuitry of claim 6, wherein the amplifier circuit includes first and second transistor devices having a common control electrode supplied with bias voltage.

11. The circuitry of claim 10, wherein the first DC current path is provided via the first transistor device, and the second DC current path is provided via the second transistor device.

12. The circuitry of claim 6 further comprising a frequency filter circuit coupled between the mixer circuit and the amplifier circuit.

13. The circuitry of claim 6, wherein the first switching circuit is provided by a first transistor controlled by the first local oscillator signal, and the second switching circuit is provided by a second transistor controlled by the second oscillator signal.

14. The circuitry of claim 13, wherein the amplifier circuit includes a single transistor device coupled to a common node between the first transistor and the second transistor and supplied with bias voltage.

15. The circuitry of claim 6, wherein each of the first and second switching circuits in the mixer circuit includes multiple field effect transistors (FETs), and the amplifier circuit includes multiple transistors.

16. The circuitry of claim 15, wherein the mixer circuit and the amplifier circuit are configured so as to utilize channel resistance of the FETs as balancing resistors for the amplifier circuit.

17. The circuitry of claim 6 further comprising a local oscillator balun for converting an unbalanced signal at a single ended local oscillator input of the frequency conversion circuitry into a balanced signal supplied to the mixer circuit.

18. The circuitry of claim 6 further comprising an output balun for converting a balanced signal at the output of the amplifier circuit into an unbalanced signal supplied from an output of the frequency conversion circuitry.

19. The circuitry of claim 6 further comprising a local oscillator buffer amplifier coupled between a local oscillator input of the frequency conversion circuitry and the mixer circuit.

* * * * *